(12) United States Patent
Madane et al.

(10) Patent No.: US 11,506,726 B2
(45) Date of Patent: Nov. 22, 2022

(54) SYSTEM AND METHOD FOR DETECTING COIL FAULTS

(71) Applicant: DANFOSS POWER SOLUTIONS II TECHNOLOGY A/S, Nordborg (DK)

(72) Inventors: Mayura Arun Madane, Pune (IN); Nilesh Surase, Pune (IN); Arjun Tr, Kerala (IN); Amogh Kank, Maharashtra (IN)

(73) Assignee: DANFOSS POWER SOLUTIONS II TECHNOLOGY A/S, Nordborg (DK)

( * ) Notice: Subject to any disclaimer, the term of this patent is extended or adjusted under 35 U.S.C. 154(b) by 600 days.

(21) Appl. No.: 16/557,656

(22) Filed: Aug. 30, 2019

(65) Prior Publication Data

US 2020/0072893 A1 Mar. 5, 2020

(30) Foreign Application Priority Data

Aug. 31, 2018 (IN) .............................. 201811032735

(51) Int. Cl.
| | |
|---|---|
| *H01F 7/08* | (2006.01) |
| *F16K 37/00* | (2006.01) |
| *G01R 31/72* | (2020.01) |
| *H01F 7/06* | (2006.01) |
| *F16K 31/06* | (2006.01) |

(52) U.S. Cl.
CPC .......... *G01R 31/72* (2020.01); *F16K 31/0675* (2013.01); *F16K 37/0041* (2013.01); *H01F 7/064* (2013.01); *H01F 7/081* (2013.01)

(58) Field of Classification Search
CPC ............. F16K 31/0613; F16K 31/0675; F16K 37/0041; F15B 13/0442; F15B 19/005; F15B 2211/327; F15B 2211/8636; F15B 2211/87; G01R 31/52; G01R 31/54; G01R 31/72; H01F 7/064; H01F 7/081; H01F 7/1844
See application file for complete search history.

(56) References Cited

U.S. PATENT DOCUMENTS

| | | | | | |
|---|---|---|---|---|---|
| 3,526,835 | A | * | 9/1970 | Jones, Jr. ................ | G01R 31/72 324/537 |
| 4,932,246 | A | * | 6/1990 | Deutsch ............. | G01R 31/2829 73/114.45 |
| 5,153,522 | A | * | 10/1992 | Sano .................... | F16K 31/0675 324/546 |
| 5,450,328 | A | * | 9/1995 | Janke ..................... | G01R 31/42 702/65 |
| 5,548,210 | A | * | 8/1996 | Dittrich .............. | G01R 31/3278 324/415 |
| 6,646,448 | B2 | * | 11/2003 | Ko ......................... | G01R 31/72 324/213 |

(Continued)

FOREIGN PATENT DOCUMENTS

| | | |
|---|---|---|
| CN | 103336189 A | 10/2013 |
| EP | 2551684 B1 | 9/2014 |
| EP | 2844857 B1 | 7/2019 |

*Primary Examiner* — Matthew W Jellett
(74) *Attorney, Agent, or Firm* — Merchant & Gould P.C.

(57) ABSTRACT

A system and method for detecting the location of coil open and coil short faults. The method includes obtaining an instantaneous admittance signature of each solenoid coil, sending out a periodic test signal to each valve, obtaining a new admittance signature; and calculating the coil-open and coil-short faults.

21 Claims, 7 Drawing Sheets

(56) References Cited

U.S. PATENT DOCUMENTS

| | | | | |
|---|---|---|---|---|
| 7,609,069 B2* | 10/2009 | Berg | ............ | G01R 31/72 |
| | | | | 324/726 |
| 8,405,403 B2* | 3/2013 | Walker | ............ | H01F 7/1844 |
| | | | | 324/545 |
| 8,925,566 B2 | 1/2015 | Haller | | |
| 9,195,229 B2* | 11/2015 | Stokes | ............ | G05B 23/0256 |
| 9,222,242 B2 | 12/2015 | Yuan et al. | | |
| 9,329,099 B2 | 5/2016 | Long et al. | | |
| 9,459,320 B2* | 10/2016 | Viswanathan | ............ | G01R 31/343 |
| 9,759,760 B2* | 9/2017 | Leif | ............ | G01R 31/2829 |
| 11,243,269 B2* | 2/2022 | Madane | ............ | F15B 13/044 |
| 2020/0072892 A1 | 3/2020 | Madane et al. | | |

* cited by examiner

| Admittance Value | Coil Health |
|---|---|
| A1 | OK |
| A2 | Coil short circuit failure |
| A3 | Coil open circuit failure |
| ... | ... |

FIG. 6

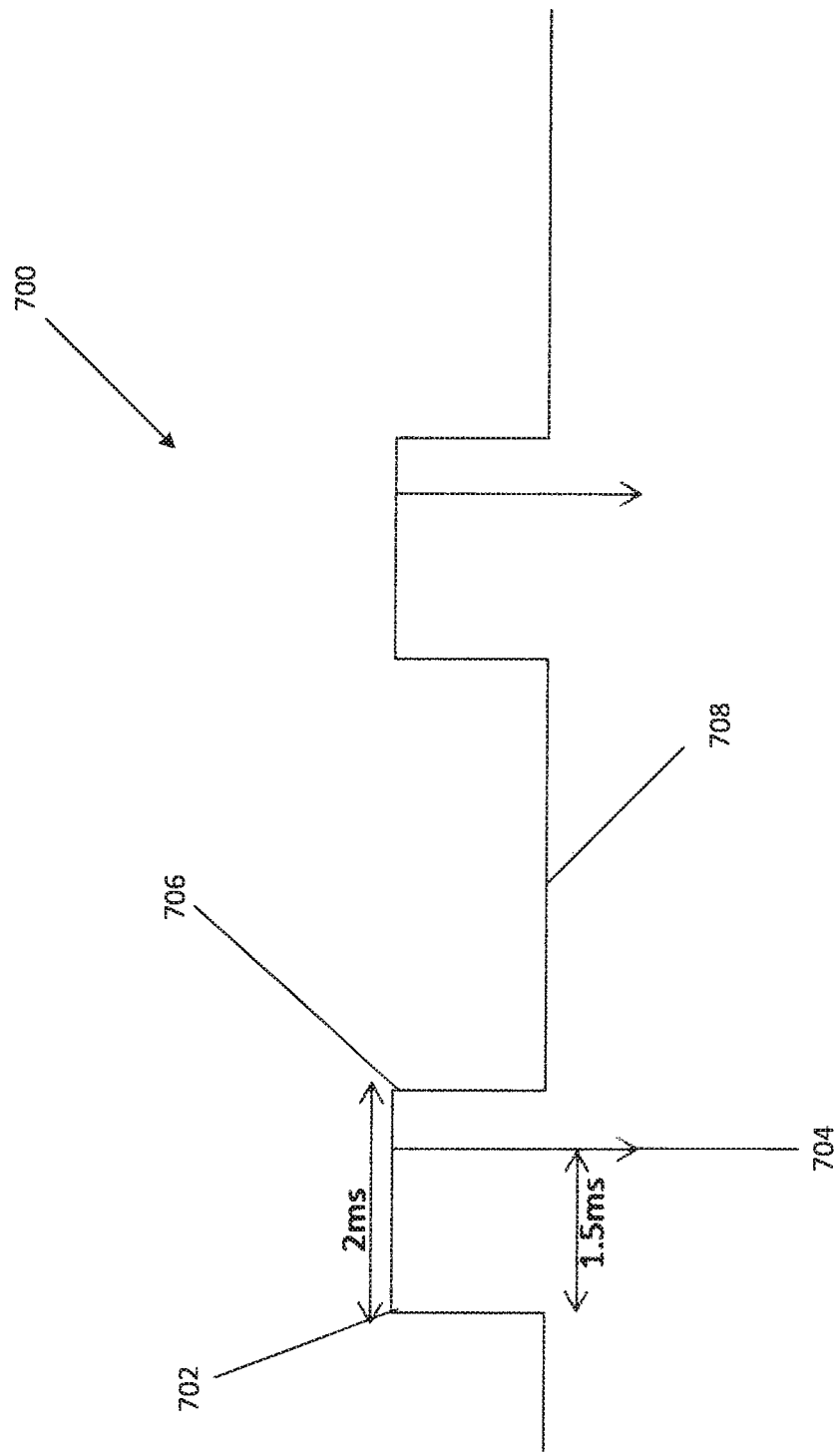

SYSTEM AND METHOD FOR DETECTING COIL FAULTS

PRIORITY

The present application is related to and claims priority to Indian Provisional Patent Application Ser. No. 201811032735, filed Aug. 31, 2018, entitled "System and Method for Detecting Coil Faults." The subject matter disclosed in that provisional application is hereby expressly incorporated into the present application in its entirety.

BACKGROUND

Many mechanical systems, such as hydraulic systems, include valves to regulate fluid flow. In the case of hydraulic systems, valves are used to regulate the flow of hydraulic fluid. Valves include a flow or pressure regulating member that moves relative to a port in a fluid flow passage to regulate fluid flow. Some hydraulic systems include spool valves, where the regulating member is one or more lands of a spool that moves within a flow passage. In some systems, the regulating member is driven by a solenoid linear actuator. It is not uncommon for a single system to include up to 50 or more valves.

In example systems, the multiple valves are connected in series-parallel combinations. Failure of even a single valve can prevent the entire system from working. Failure of the valves often occurs due to short-circuiting of the electronic panel. This can cause the valve to remain open due to coil burnout. Other problems include a weakening of the enamel coating of the coils due to vibrations and temperature. This can cause some of the turns of the coil to shorten, which reduces the total number of effective turns and thus reducing the impedance.

Failure of a valve can lead to many problems that require time and money to repair. Traditional monitoring methods include monitoring steady state current values after the operating of the valve, or monitoring the current waveform and amplitude after a test pulse of fixed width and comparing the measured current values with predetermined current values. However, if the end voltage, operating temperature, and short conditions are changed, accurate results are not able to be determined. Therefore, there is a need to develop a cost and time effective system for monitoring fault diagnostics of the coils used in solenoid operated valves.

SUMMARY

In general terms, the present disclosure is directed to systems and methods that provide for cost-effective and/or otherwise improved solenoid-valve diagnostics. More particularly, systems and methods include detection methods for coil-open and coil-short fault detection for solenoid operated valves. Various aspects are described in this disclosure, which include, but are not limited to, the following aspects.

According to certain aspects of the present disclosure, a method for detecting the location of coil open and short faults is described. The method also determines the degree of the fault of the coil(s). The method includes sending out a periodic test signal to each coil, obtaining an instantaneous current signature, calculating the admittance signature of each coil; and calculating the coil-open and coil-short faults.

In a first embodiment, a method for monitoring the admittance value of at least one coil in a solenoid-controlled value is disclosed. The method includes generating a test supply voltage by a power supply and supplying the voltage to at least one of the coils. An instantaneous current signature of at least one of the coils by a current sensing circuit is measured. The test supply voltage to the at least one of the coils is disconnected. Then the admittance value of at least one of the coils by a processing circuit is calculated.

In another embodiment, a system for monitoring the admittance value of at least on coil in a solenoid-controlled valve assembly is disclosed. The system includes the following components: a solenoid operated valve comprises at least one coil, a power supply providing a test supply voltage, a current sensing circuit for measuring an instantaneous current signature of the at least one coil upon actuating the solenoid operated valve, a power supply switching circuit for selectively connecting and disconnecting the test supply voltage from the at least one coil, and a processing circuit coupled to the power supply, the current sensing circuit, and the power supply switching circuit. The processing circuit is configured to measure an admittance value. The admittance value is determined as the ratio of the instantaneous current signature to the test supply voltage of the at least one coil.

The summary is provided to introduce a selection of concepts in a simplified form that are further described below in the Detailed Description. This summary is not intended to identify key feature or essential features of the claimed subject matter, nor is it intended to be used to limit the scope of the claimed subject matter.

BRIEF DESCRIPTION OF THE DRAWINGS

The following drawings are illustrative of particular embodiments of the present disclosure and therefore do not limit the scope of the present disclosure. The drawings are not to scale and are intended for use in conjunction with the explanations in the following detailed description. Embodiments of the present disclosure will hereinafter be described in conjunction with the appended drawings, wherein like numerals denote like elements.

FIG. 6 is a schematic illustration of a look-up table used in the system of FIG. 1.

FIG. 7 is an illustration of a time period of generating test supply voltage signals.

Corresponding reference characters indicate corresponding parts throughout the several views. The exemplifications set out herein illustrate an embodiment of the invention, and such exemplifications are not to be construed as limiting the scope of the invention in any manner.

DETAILED DESCRIPTION

Figure 1:
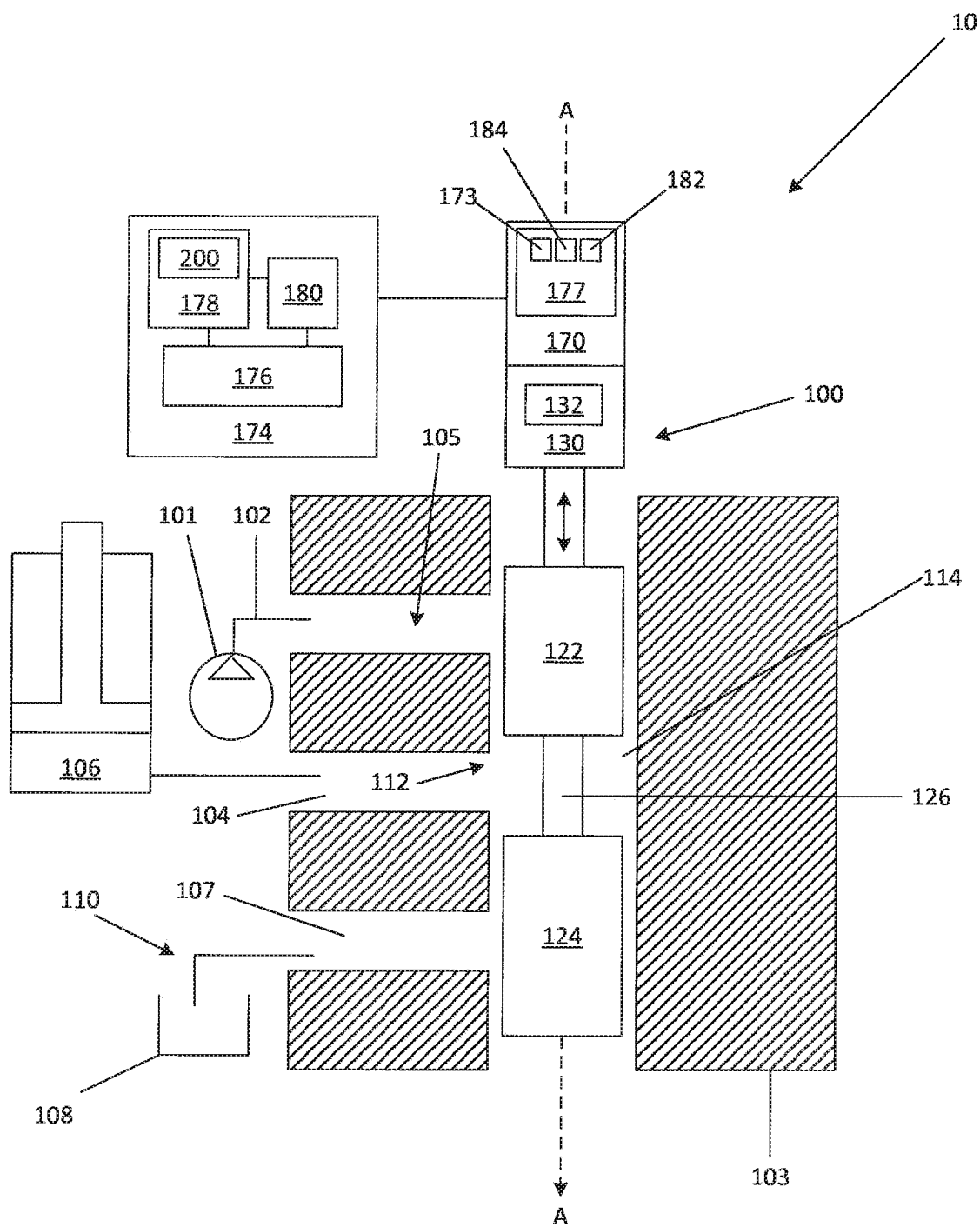
FIG. 1 is a schematic illustration of an example system including a valve assembly according to the present disclosure.

Various embodiments will be described in detail with reference to the drawings. Reference to various embodiments does not limit the scope of the claims attached hereto. Additionally, any examples set forth in this specification are not intended to be limiting and merely set forth some of the many possible embodiments for the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

When coils of a solenoid-controlled valve deteriorate or wear out, the position of flow or pressure regulating members of those valves can deviate from what is expected from a given operating command on the system, resulting in, for example, too much or too little flow, an undesirable pressure differential across the valve, etc. It is therefore beneficial to detect faults before they occur, so that the coils can be fixed or replaced before the valve fails.

Primary issues that occur are coil short circuits and coil open circuit failures. A coil short circuit failure occurs when the enamel coating of the coil is weakened due to vibration or temperature, which causes some of the turns of the coil to shorten, thereby reducing the total number of effective turns and reducing the impedance. When a coil short circuits, the functioning of a valve does not immediately stop. The valve might still continue to function normally, but the deterioration of the coil is accelerated. A deteriorated coil may draw additional current, which can stop the functioning of the system and cause the temperature to rise, which can damage the coil permanently.

The systems and methods described herein provide a cost effective solution for the real time health monitoring and fault diagnostics of coils used in solenoid operated valves. An algorithm can be run on existing processors if existing processors are available. If a valve system does not include on-board electronics, an additional device is used to sense the voltage and current signatures to run the algorithm. The device also has communication capabilities with a centralized controller.

FIG. 1 represents a mechanical system 10 that at least partially operates through the use of hydraulics. The hydraulics include a non-limiting embodiment of a valve assembly 100 used to illustrate principles of the present disclosure. In some examples, the valve assembly is a flow metering valve. The valve assembly 100 includes a housing 103 (e.g., a valve body, a manifold, or the like), a spool 112 mounted in a spool bore 114, the spool bore 114 defined by the housing 103. In this example, the spool valve is a three-way spool valve. However, the principles of the present disclosure are readily applied to other spool valves (e.g., two-way spool valves) and other fluid control valves. The spool 112 includes a shaft 126 coupled to a pair of metering lands 122, 124 on either end of the shaft 126. Each metering land 122, 124 is a regulating member (e.g., a fluid flow and/or fluid pressure regulating member) of the valve assembly 100. A solenoid linear actuator 130 is coupled to the spool 112 and is adapted to drive axial linear movement of the spool 112 within the spool bore 114, the linear movement being along the central axis A of the spool bore 114. The solenoid linear actuator 130 houses the coil 132, which is used to generate a controlled magnetic field that drives axial movement of a magnetic core coupled to the spool 112. The valve moves proportionally to the applied magnetic field applied.

A fluid supply 101 (e.g., a pump) supplies hydraulic fluid via a supply line 102 through a supply port 105 to a work port 104. The work port 104 is connected to a hydraulic cylinder 106 that drives a load, i.e., a load of a piece of hydraulic equipment or machinery. Fluid from the work port 104 empties to the tank 108 via a tank port 107 and a tank line 110. The spool 112 can be moved to a first position in which metering land 122 opens fluid communication between the supply port 105 and the work port 104, and the metering land 124 closes fluid communication between the work port 104 and the tank port 107. The spool 112 can also be moved to a second position in which the metering land 122 closes fluid communication between the supply port 105 and the work port 104, and the metering land 124 opens fluid communication between the work port 104 and the tank port 107. In certain example, the metering lands 122, 124 can provide a metering function to control flow rate through the valve.

In certain examples, the mechanical system 10 maintains a constant or controlled pressure differential across the valve. In other examples, position of the spool 112 in combination with sensed pressure differential can be used to estimate flow rate through the ports.

A control unit 170 is operatively and fixedly mechanically coupled to the solenoid linear actuator 130 and is configured to provide control signals that generate current in the solenoid linear actuator 130 to drive axial linear movement of the metering lands 122, 124 along the axis A. The control unit 170 is in a fixed position relative to the coil or coils of the solenoid linear actuator 130. The control unit 170 is positioned outside the spool bore 114 and any hydraulic flow passage, and so is not exposed to hydraulic pressure generated by the mechanical system 10.

The control unit 170 is also configured to provide test supply voltage signals to the coils 132. Test supply voltage signals are provided for a time period long enough to generate a current in the coil 132, but not long enough that it heats up the coil 132. This is shown in more detail in FIGS. 2-4.

In an embodiment, the control unit 170 includes a monitoring unit 177. Monitoring unit 177 includes a current sensing circuit 173, a power supply switching circuit 182, and a processing circuit 184. Monitoring unit 177 is operatively connected to coils 132 and is configured to measure a test supply voltage and an instantaneous current signature to determine the admittance of the coils 132. In another embodiment, the control unit 170 is capable of determining the admittance of the coil 132 without the monitoring unit.

In an embodiment, the control unit 170 includes a PCB or other circuitry. The PCB also includes control electronics, which can be used to determine admittance. In another embodiment, a separate processor may be used to sense voltage and current signature and to determine the admittance. The separate processor may connect to a centralized controller of the solenoid-valve assembly.

It should be noted that throughout the specification, "coils" are often referred to in the plural. However, it should be noted that determined the admittance of each coil is an independent event, as the admittance is calculated on a per coil basis. In an embodiment, the admittance of each coil may be measured at the same time. Alternatively, the admittance of each coil may be measured at different times.

The admittance is calculated for each coil may be calculated on a regular basis, for example every 30 seconds, every 5 minutes, every hour, once a day, or once a week. Alternatively, the admittance may be calculated on an irregular basis, for example as the age of an individual coil increases.

The current sensing circuit 173 can includes an electrical current meter, e.g., an ammeter, adapted to measure electrical current in the coil or coils of the solenoid linear actuator 130. The monitoring unit 177 may be included in the control unit 170 or, optionally, positioned remotely from the control unit 170, is adapted to measure inductance in the coil 132 or coils of the solenoid linear actuator 130.

The current sensing circuit 173 measures an instantaneous current signature of each coil 132 in the mechanical system 10. The current sensing circuit 173 is operatively connected to coil 132. For example, if a mechanical system 10 comprises multiple coils 132, each coil is in communication with a current sensing circuit 173.

Measurements from the current sensing circuit 173 are analyzed by the processing circuit 184 and are fed to an operating subsystem 174 of the mechanical system 10. The operating subsystem 174 is operatively coupled to the control unit 170. The operating subsystem 174 includes one or more power supply switching circuit 180 adapted to execute computer readable instructions and to process signals received from the control unit. The operating subsystem 174 also includes a processor 200, a memory 178 and a command interface 176, both operatively coupled to the one or more power supply switching circuit 180. In addition to storing computer readable instructions, the memory 178 also stores a look-up table.

In an example embodiment, a test supply voltage is generated when applied to the coil 132. The initial voltage is either measured by the power supply itself or the current sensing circuit 173. After a predetermined period of time, the admittance is calculated and then the supply voltage is disconnected from the coil 132.

Figure 2A:
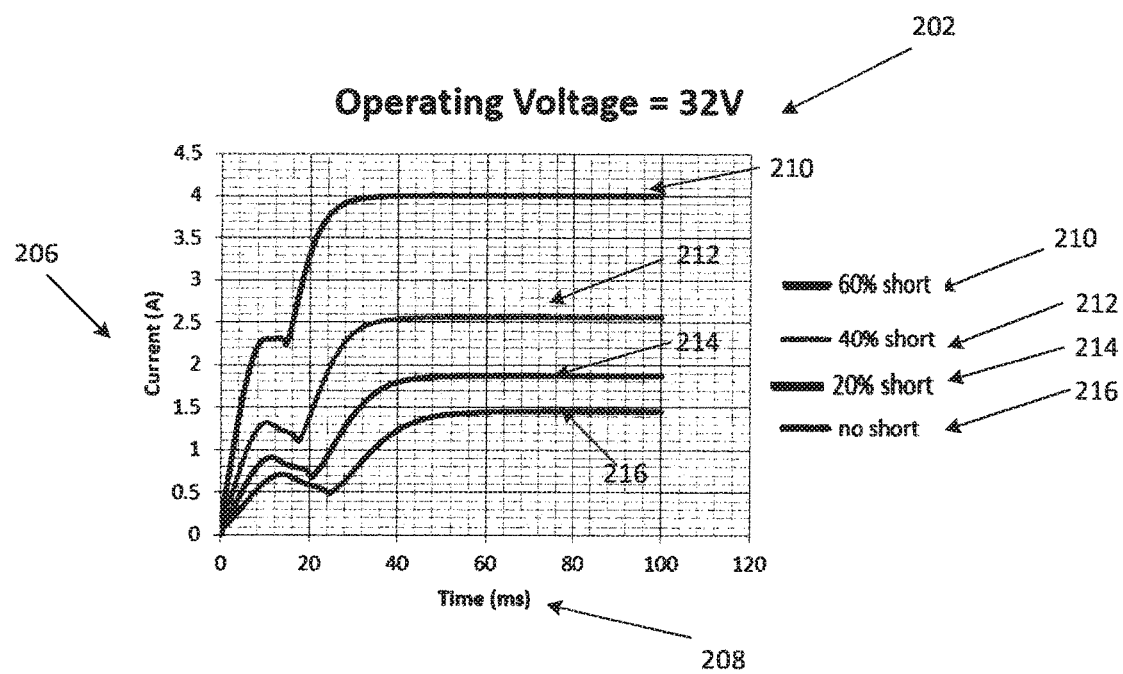
FIGS. 2a-2b illustrate the effect of voltage on current profiles at different operating voltages.
Figure 2B:
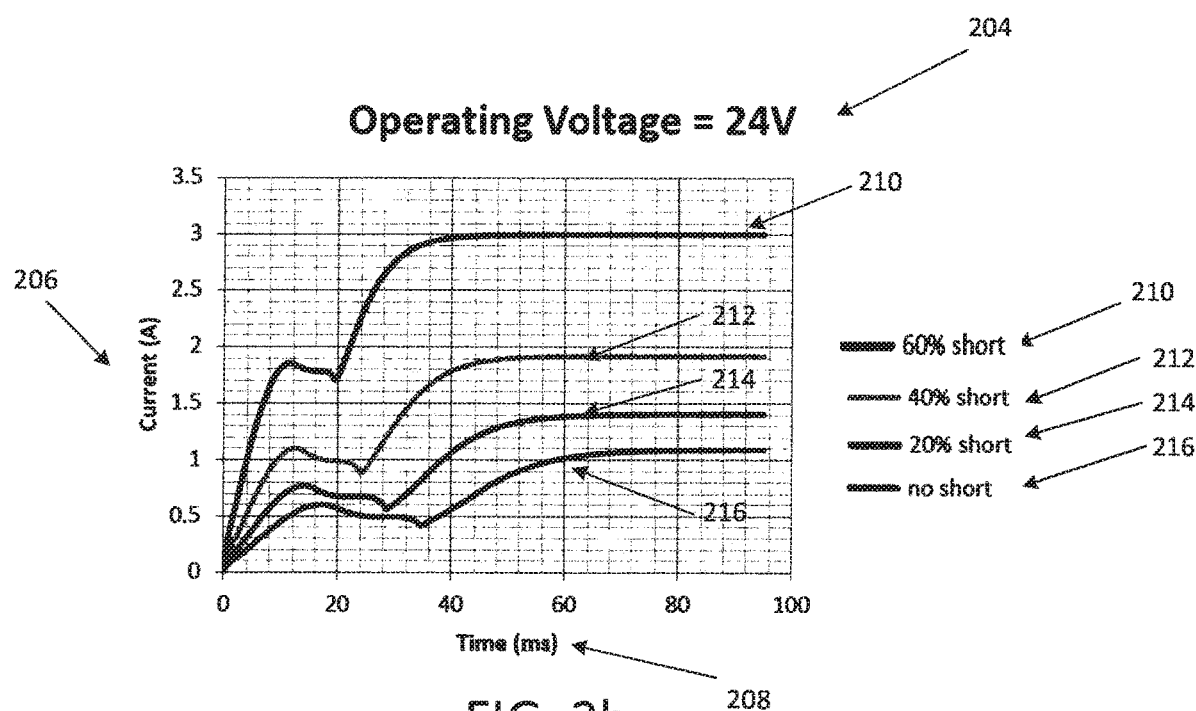

FIGS. 2a and 2b illustrate the effect of voltage on current profiles at an operating voltage of 32V 202 and 24V 204. The change in current 206 is shown as a function of time 208. Plotted shortages includes no short 216, 20% short 214, 40% short 212, and 60% short 210. When the settled current values are measured, voltage noise is present in the signal. When current is measured when the current values have settled, for example, at 2.6 A, a 75% short in 24V operating condition occurs, and a 60% short occurs in a 32V operating condition.

Figure 3:
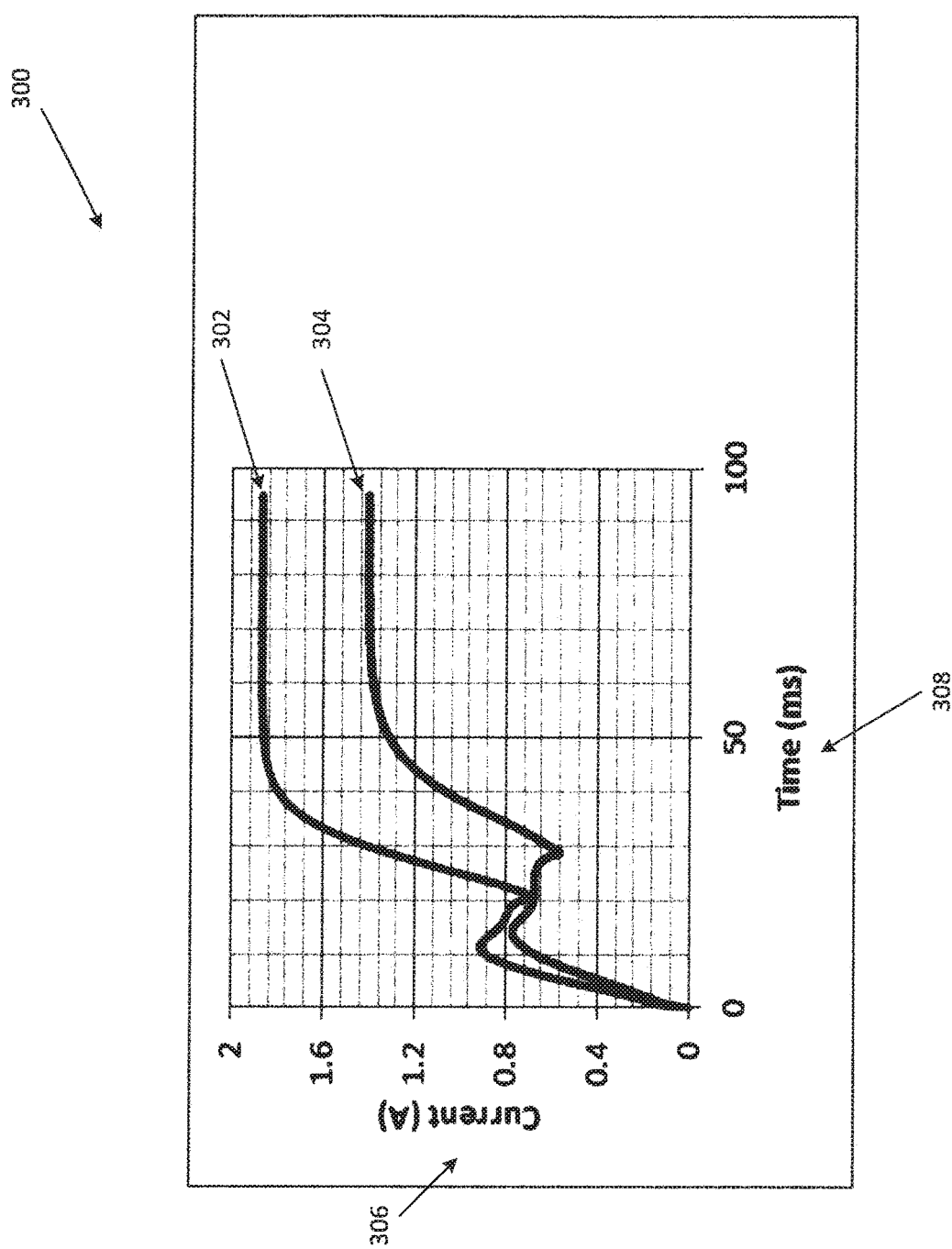
FIG. 3 is a graph demonstrating the effect of temperature on current.

FIG. 3 illustrates the effect on current 306 as a function of time 308 at different operating temperatures. Line 302 represents the lowest operating temperature and line 304 represents the highest operating temperature. The effect on temperature increases as time passes. As time passes, current in the circuit rises and the voltage drop across coils resistance becomes greater. Since resistance is temperature dependent, the effect of temperature becomes a factor after a period of time has passed.

The test at which the instantaneous current is measured (also referred to as a test signal time) is from about 0.1 millisecond to about 2 milliseconds. For example, a test signal may be 1.5 milliseconds. As shown in FIG. 3, as time passes, current in the circuit increases and voltage decreases, which affects resistance. Graph 300 illustrates that a difference in temperature can have an effect on current as time progresses. Since resistance is temperature dependent, temperature can affect the current, but only after a period of time. Therefore, the time period must be long enough to measure a voltage of the coils, but short enough that the current does not affect the temperature of the coil.

The admittance is calculated by finding the value of the instantaneous current over the voltage supplied. Admittance as measured at the test signal time is not temperature dependent.

Figure 4:
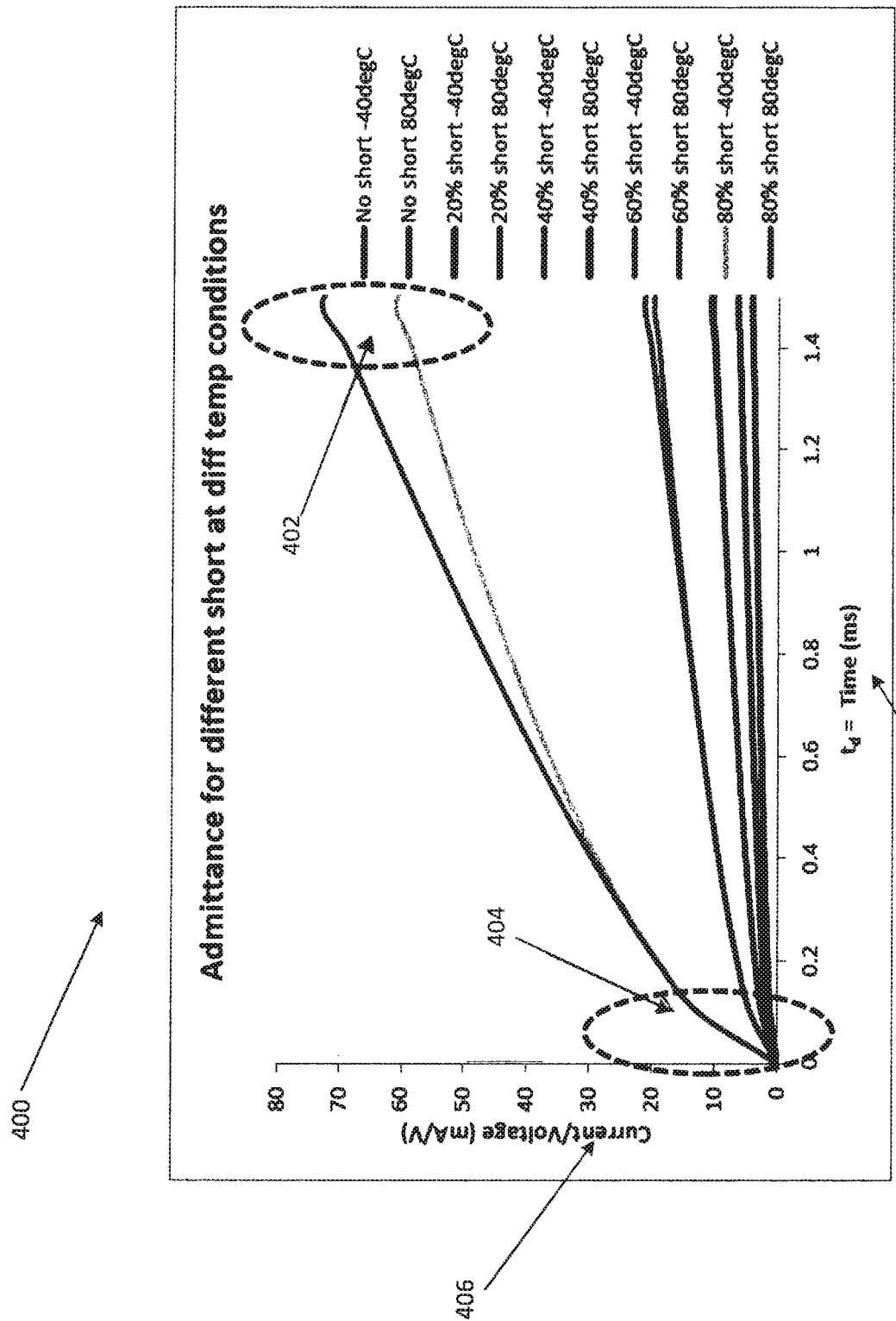
FIG. 4 is a graph illustrating the admittance for different shortages at different temperatures.

FIG. 4 illustrates another graph 400 demonstrating the effect of temperature on admittance. As shown, as time 408 increases, the effect of temperature noise is increased. For example, the test signal time needs to be at least 0.2 milliseconds before a change in instantaneous current is measurable.

The current/voltage 406 is shown as a function of time 408. The effect of temperature noise is visible as $t_d$ is increased as shown at circle 402. The initial admittance is free from temperature noise as shown at circle 404.

Figure 5:
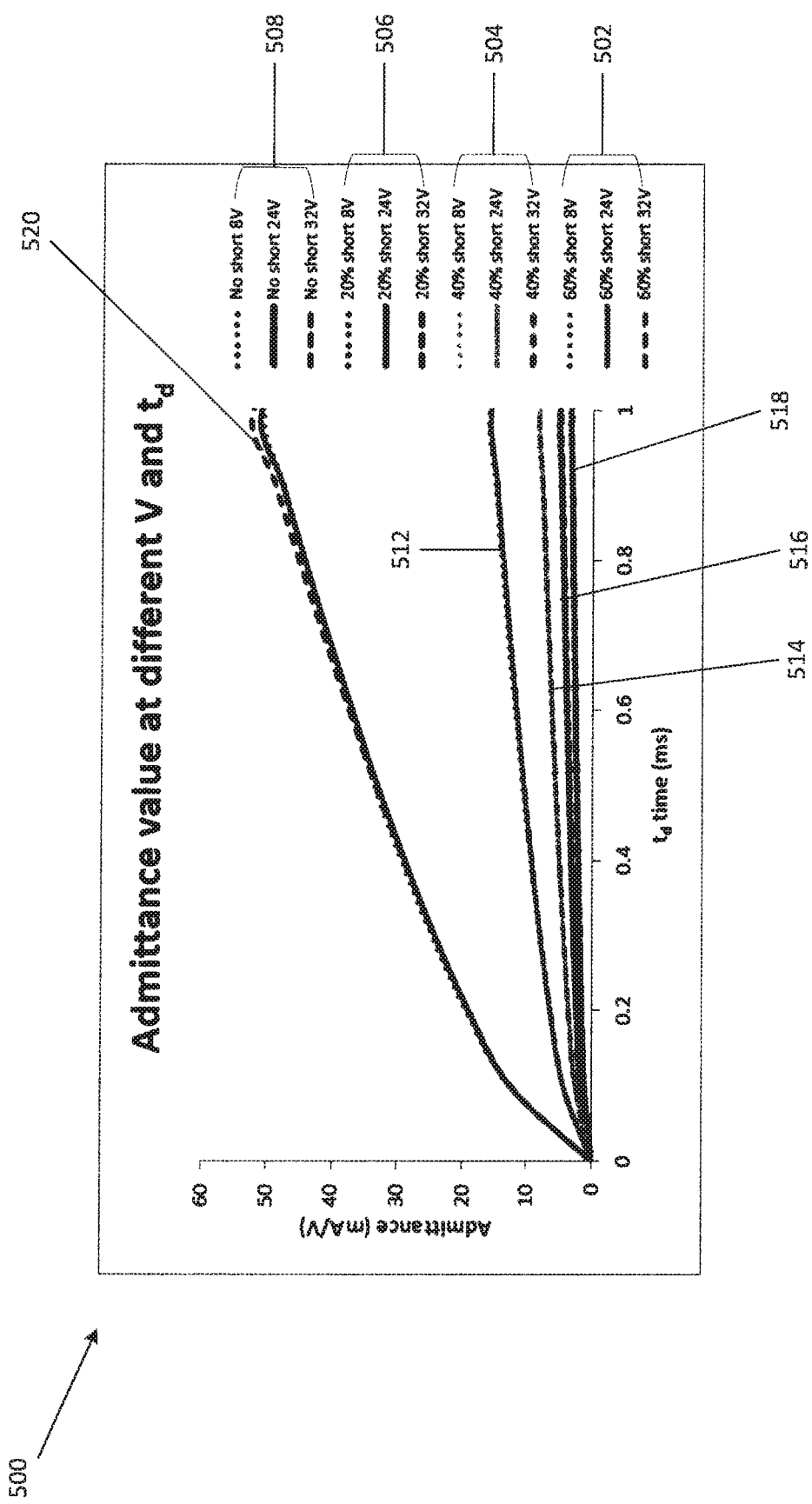
FIG. 5 is a graph illustrating the admittance values at different voltages over time.

As shown in FIG. 5, the admittance value does not significantly change due to a change in voltage supplied to the coils. Graph 500 illustrates the admittance values for different short conditions. Group 502 is an average of 60% shorts at 8V, 24V and 32V. Group 504 is an average of 40% shorts at 8V, 24V and 32V. Group 506 is an average of 20% shorts at 8V, 24V and 32V.

The graph 500 illustrates five groupings of lines, each grouping of lines including three individual lines. Grouping of lines 520 illustrates the effect of different temperatures on current/voltage. As shown, the grouping of lines 520 demonstrates that the admittance does not greatly vary at different temperatures. Grouping of lines 512 illustrates a 60% short at 8V, 24V, and 32V. Grouping of lines 514 illustrates a 40% short at 8V, 24V, and 32V. Grouping of lines 516 illustrates a 20% short at 8V, 24V, and 32V. Grouping of lines 518 illustrates a no short at 8V, 24V, and 32V.

FIG. 5 demonstrates the nominal different in admittance value based on the voltage supplied to the coil. A voltage of 8 volts, 24 volts, or 32 volts may be applied to the coil as a test supply voltage.

The initial admittance signature of a solenoid coil is used to detect coil open and coil short faults. Each individual solenoid valve in a device is monitored by a periodic test signal. At the end of each test signal, a new admittance signature is calculated and the coil open and coil short faults are calculated. These calculated are stored and displayed, for example, in a look up table. A coil open fault will produce an admittance value of 0. A coil short fault will produce an admittance value below a predetermined threshold. As shown in FIG. 5, the lower the admittance value, the lower the short of the coil.

A look up table as shown in FIG. 6 may be used to determine if the admittance value is associated with a predicted circuit failure. The lookup table 600 includes admittance values 602 and coil health indications 604. For example, an admittance value of A1 612 indicates that the coil health is "OK" 614, meaning the coil is functioning to an acceptable level. An admittance value of A2 622 indicates a potential coil short circuit failure 624. Such an indication indicates that the coil needs to be replaced. An admittance value of A3 632 indicates a potential coil open circuit failure. Such an indication also indicates that the coil needs to be replaced.

In a first embodiment, the look up table can rely on a fault detection algorithm. The fault detection algorithm can determine the location of the coil open and coil short faults, and which valve is failing. The algorithm can also determine the degree of the fault in coil-short faults. A user can use the information provided by the algorithm to anticipate coil-short faults that may accelerate coil deterioration and provide proactive maintenance.

In another embodiment, the look up table can be populated with empirical values. For example, previously calculated values and their relationship to coil health can be used to populate the look up table for future use. The values can determine the location of the coil open and coil short faults, and which valve is failing. A user can use the information provided by the lookup table to determine or anticipate coil-short faults that may accelerate coil deterioration and provide proactive maintenance.

FIG. 7 illustrates an example diagram 700 of a test supply voltage applied to the coils over time. The test supply voltage is applied to a coil at 702. After the test supply voltage has been applied for, for example, 1.5 milliseconds, the instantaneous current signature of the coil is measured at 704. After the value of the instantaneous current signature has been determined, the test supply voltage is stopped at 706. A time delay 708 occurs before the next test supply signal is generated. The time delay 708 is at least 0.01 milliseconds, for example 0.1 milliseconds.

The time of the time delay may be a recurring basis, for example every 30 seconds, every 5 minutes, every hour, once a day, or once a week. Alternatively, the time delay may be an irregular basis, for example as the age of an individual coil increases. The time delay is great enough as to cool the coil between test supply voltage signals, so the coil does not increase in temperature.

The time the test supply voltage is applied to the coil for at least 1.5 milliseconds, for example 2 milliseconds. In another embodiment, the test supply voltage may be applied to the coil for up to 3 milliseconds. The test supply voltage is applied to the coil for a time long enough to measure the current through the coil, but not long enough to increase the temperature of the coil.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

Although the present disclosure has been described with reference to particular means, materials and embodiments, from the foregoing description, one skilled in the art can easily ascertain the essential characteristics of the present disclosure and various changes and modifications may be made to adapt the various uses and characteristics without departing from the spirit and scope of the present invention as set forth in the following claims

What is claimed is:

1. A method for monitoring at least one coil in a solenoid-controlled valve, comprising:
    generating a test supply voltage by a power supply and supplying the voltage to the at least one coil;
    measuring an instantaneous current signature of the at least one coil by a current sensing circuit;
    disconnecting the test supply voltage to the at least one coil;
    calculating an admittance value of the at least one coil by a processing circuit; and
    identifying a fault condition in the at least one coil by comparing the admittance value to a reference value.

2. The method of claim 1, comprising measuring the instantaneous current signature after a predetermined period of time.

3. The method of claim 2, wherein the predetermined period of time is from about 0.1 millisecond to about 2 milliseconds.

4. The method of claim 1, wherein the admittance value is determined as a ratio of the instantaneous current signature to the test supply voltage of the at least one coil.

5. The method of claim 1, wherein the test supply voltage is low enough as to not move a spool of the solenoid-controlled valve.

6. The method of claim 1, wherein a time between generating the test supply voltage is at least 0.01 milliseconds.

7. The method of claim 1, wherein measuring the admittance value of the at least one coil occurs at least every 30 seconds.

8. The method of claim 1, wherein calculating the admittance value is temperature independent.

9. The method of claim 2, comprising disconnecting the test supply voltage to the at least one coil after the predetermined period of time has elapsed.

10. The method of claim 1, wherein coil the fault condition comprises a short circuit or an open circuit in the at least one coil.

11. A system for monitoring at least one coil in a solenoid-controlled valve assembly comprising:
    a solenoid operated valve comprising at least one coil;
    a power supply providing a test supply voltage;
    a current sensing circuit for measuring an instantaneous current signature of the at least one coil upon actuating the solenoid operated valve;
    a power supply switching circuit for selectively connecting and disconnecting the test supply voltage from the at least one coil; and
    a processing circuit coupled to the power supply, the current sensing circuit, and the power supply switching circuit, wherein the processing circuit is configured to determine an admittance value, the admittance value determined as a ratio of the instantaneous current signature to the test supply voltage of the at least one coil, wherein the processing circuit is configured to identify a fault condition in the at least one coil by comparing the admittance value to a reference value.

12. The system of claim 11, wherein the processing circuit is a microprocessor based controller.

13. The system of claim 11, comprising measuring the instantaneous current signature after a predetermined period of time.

14. The system of claim 13, wherein the predetermined period of time is from about 0.1 millisecond to about 2 milliseconds.

15. The system of claim 11 further comprising an interface configured to display the admittance value.

16. The system of claim 11, wherein the test supply voltage is low enough as to not move a spool of the solenoid-controlled valve assembly.

17. The system of claim 11, wherein a time between generating the test supply voltage is at least 0.01 milliseconds.

18. The system of claim 11, wherein measuring the admittance value of the at least one coil occurs at least every 30 seconds.

19. The system of claim 11, wherein calculating the admittance value is temperature independent.

20. The system of claim 11, comprising disconnecting the test supply voltage to the at least one coil after the predetermined period of time has elapsed.

21. The system of claim 11, wherein coil the fault condition comprises a short circuit or an open circuit in the at least one coil.

\* \* \* \* \*